(12) United States Patent
Park et al.

(10) Patent No.: US 9,841,669 B2
(45) Date of Patent: Dec. 12, 2017

(54) METHOD FOR FORMING CONDUCTIVE MESH PATTERN, AND MESH ELECTRODE AND LAMINATE MANUFACTURED THEREBY

(71) Applicant: LG CHEM, LTD., Seoul (KR)

(72) Inventors: Jeongho Park, Dajeon (KR); Bu Gon Shin, Daejeon (KR); Jae Jin Kim, Daejeon (KR); Jongbyung Lee, Daejeon (KR); Jinmi Jung, Daejeong (KR); Yujin Jeong, Daejeon (KR)

(73) Assignee: LG CHEM, LTD., Seoul (KR)

( * ) Notice: Subject to any disclaimer, the term of this patent is extended or adjusted under 35 U.S.C. 154(b) by 41 days.

(21) Appl. No.: 15/111,435

(22) PCT Filed: Feb. 13, 2015

(86) PCT No.: PCT/KR2015/001487
§ 371 (c)(1),
(2) Date: Jul. 13, 2016

(87) PCT Pub. No.: WO2015/122720
PCT Pub. Date: Aug. 20, 2015

(65) Prior Publication Data
US 2016/0378241 A1 Dec. 29, 2016

(30) Foreign Application Priority Data
Feb. 13, 2014 (KR) .......... 10-2014-0016625

(51) Int. Cl.
| | | |
|---|---|---|
| G03F 1/50 | (2012.01) | |
| G03F 1/68 | (2012.01) | |
| G03F 1/80 | (2012.01) | |
| G03F 7/00 | (2006.01) | |
| C23C 14/18 | (2006.01) | |
| C23C 14/22 | (2006.01) | |
| C23C 14/34 | (2006.01) | |
| C23C 18/02 | (2006.01) | |

(52) U.S. Cl.
CPC .............. *G03F 1/50* (2013.01); *C23C 14/185* (2013.01); *C23C 14/221* (2013.01); *C23C 14/34* (2013.01); *G03F 1/68* (2013.01); *G03F 1/80* (2013.01); *G03F 7/0002* (2013.01); *C23C 18/02* (2013.01); *G06F 2203/04102* (2013.01); *G06F 2203/04103* (2013.01); *G06F 2203/04112* (2013.01)

(58) Field of Classification Search
CPC ..... G03F 1/50; G03F 1/68; G03F 1/80; G03F 7/0002; C23C 14/185; C23C 14/221; C23C 14/34
USPC .................... 430/5, 312, 313, 318, 319, 320
See application file for complete search history.

(56) References Cited

U.S. PATENT DOCUMENTS

| | | |
|---|---|---|
| 6,160,611 A | 12/2000 | Miyake |
| 2010/0156840 A1 | 6/2010 | Frey et al. |
| 2011/0236833 A1 | 9/2011 | Chan |
| 2015/0064628 A1 | 3/2015 | Guo |

FOREIGN PATENT DOCUMENTS

| | | |
|---|---|---|
| JP | 11237744 A | 8/1999 |
| JP | H11237744 A | 8/1999 |
| JP | 2012079435 A | 4/2012 |
| KR | 1020130044058 A | 5/2013 |
| TW | 417181 B | 1/2001 |
| TW | 201351062 A | 12/2013 |
| WO | 2013158543 A1 | 10/2013 |

*Primary Examiner* — Christopher G Young
(74) *Attorney, Agent, or Firm* — Dentons US LLP

(57) ABSTRACT

The present invention relates to a method for manufacturing a conductive mesh pattern, a mesh electrode manufactured by the same, and a laminate.

20 Claims, 13 Drawing Sheets

[Figure 1]
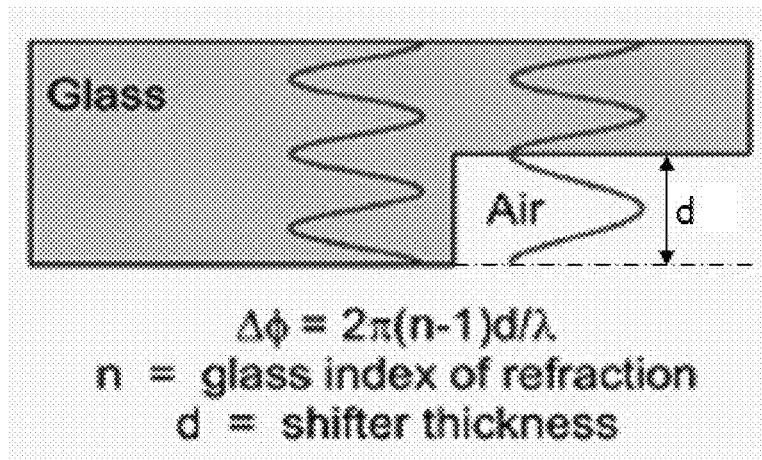
[Figure 2]
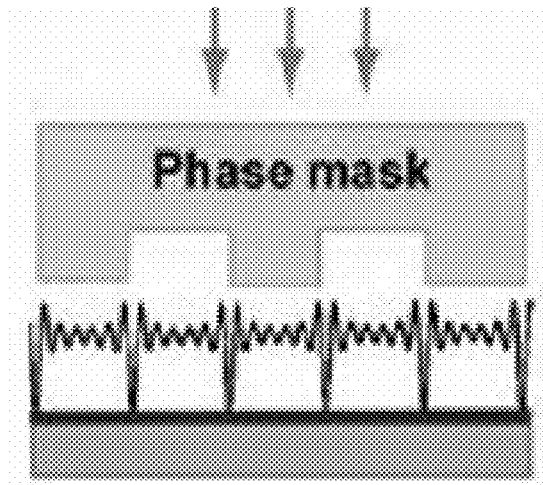

[Figure 3]
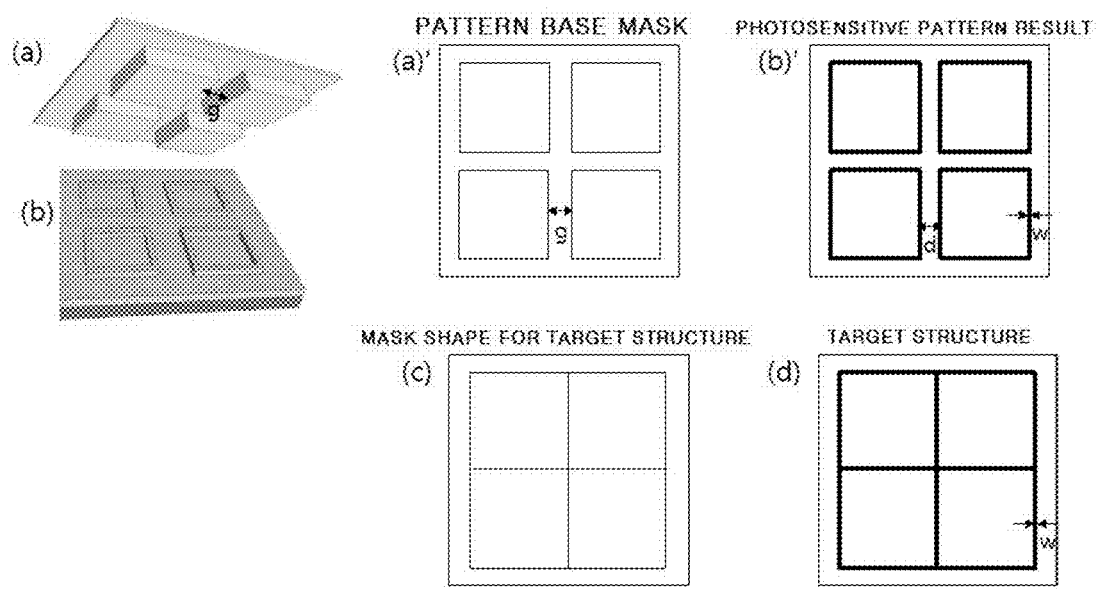

[Figure 4]
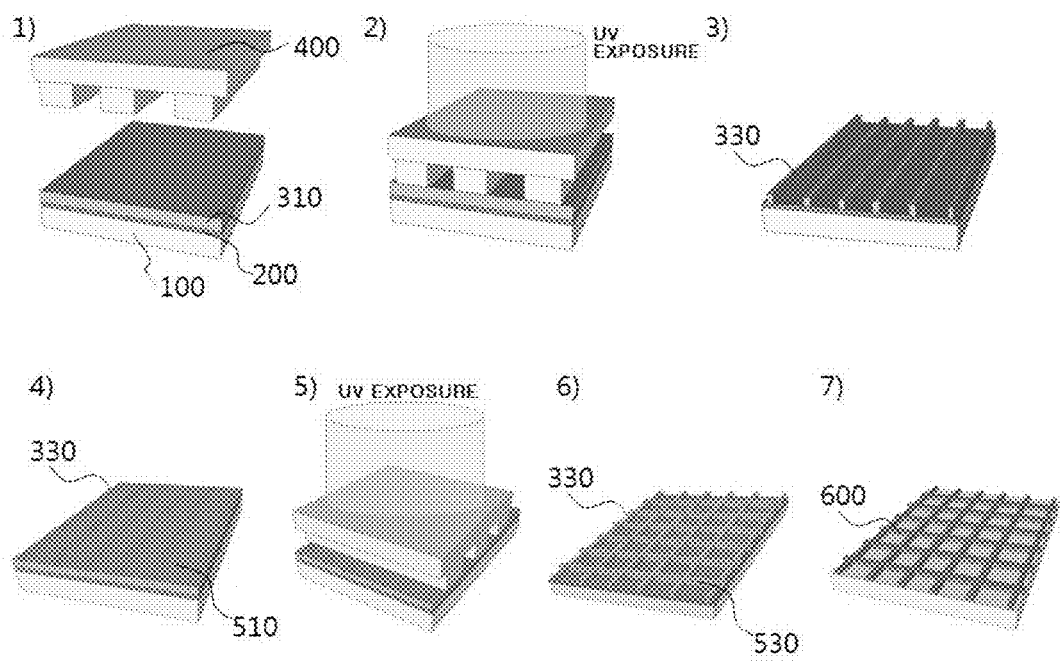

[Figure 5]
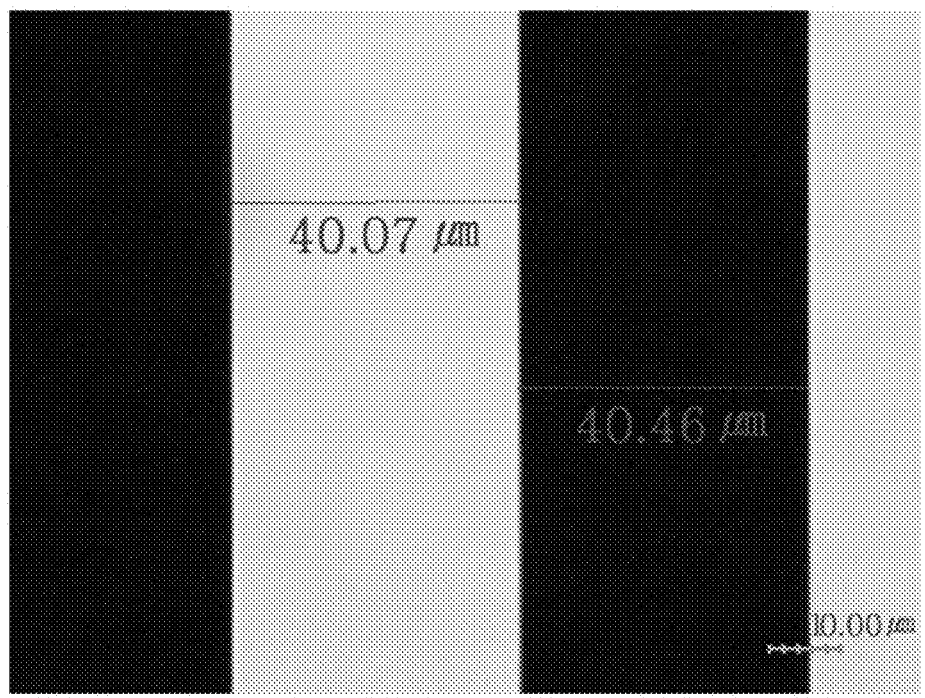

[Figure 6]
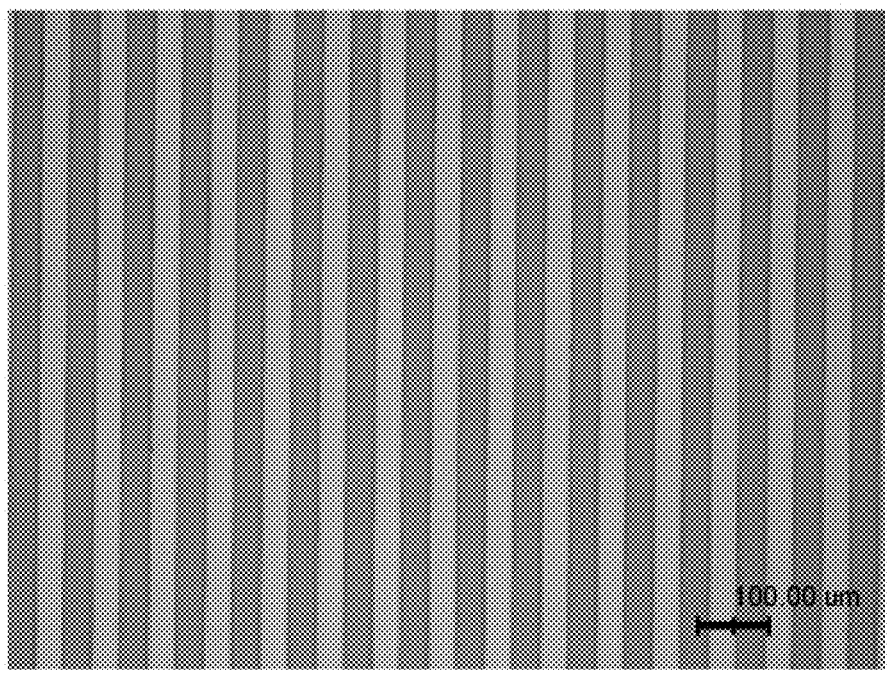

[Figure 7]
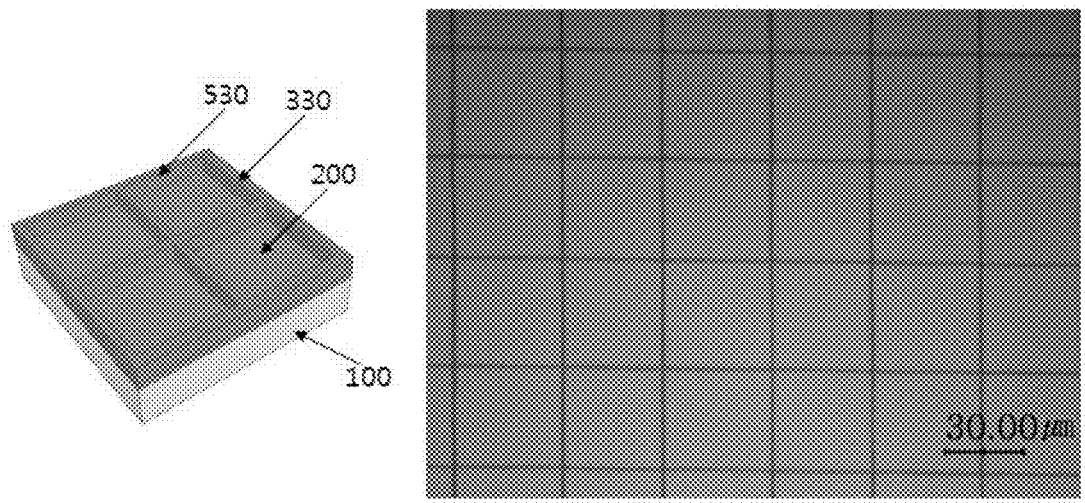

[Figure 8]
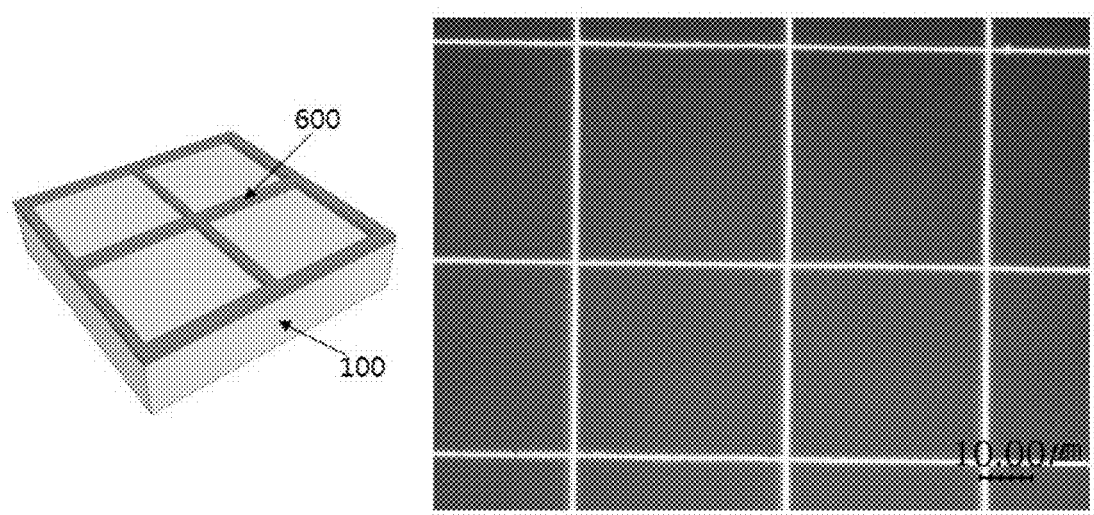

[Figure 9]
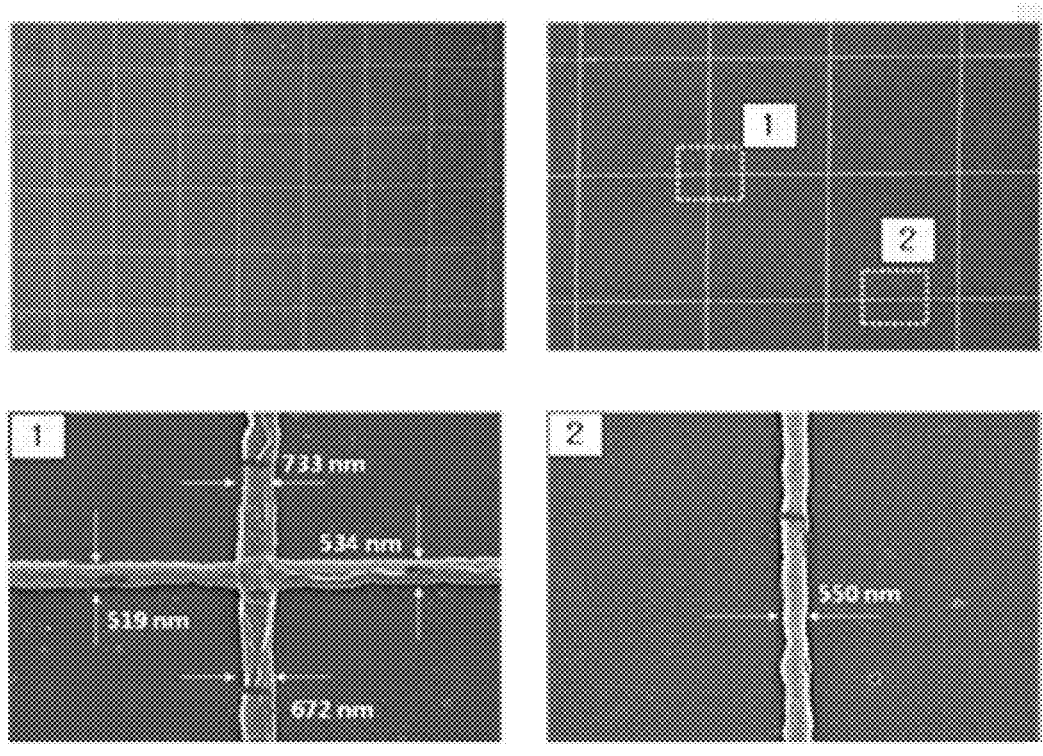

[Figure 10]
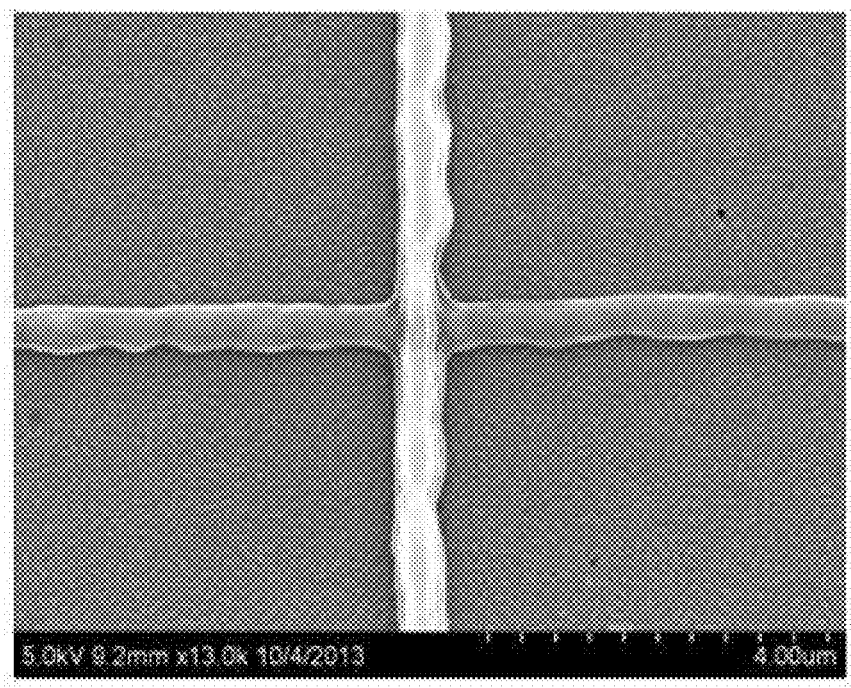

[Figure 11]
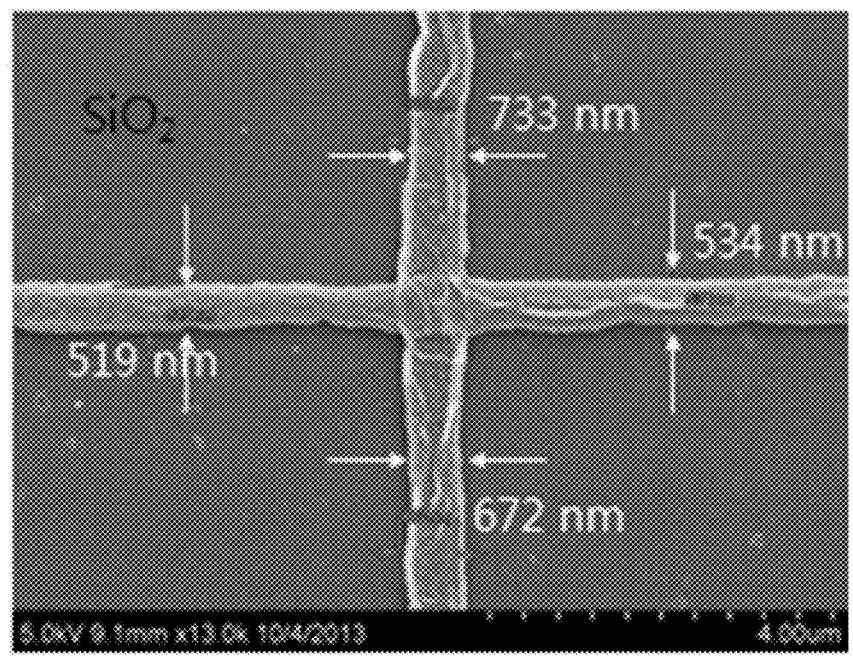

[Figure 12]
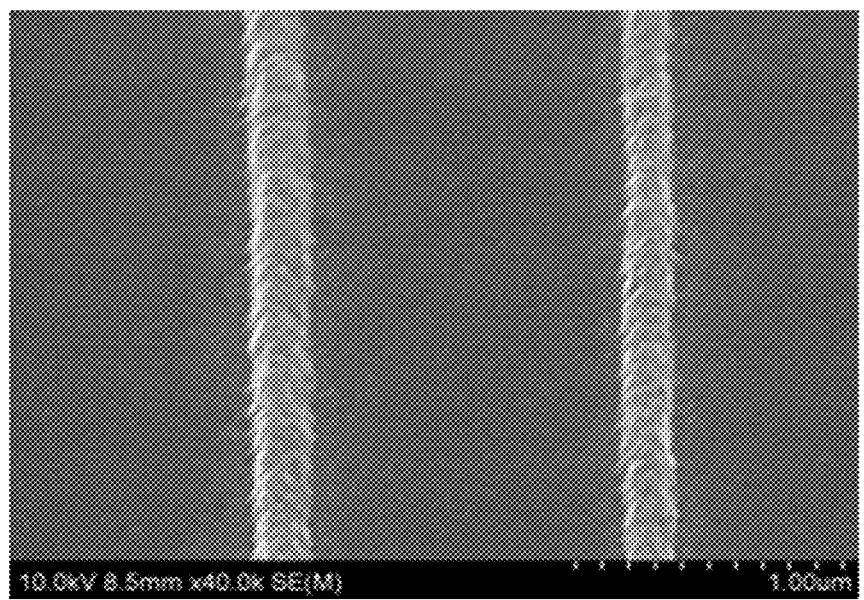

[Figure 13]
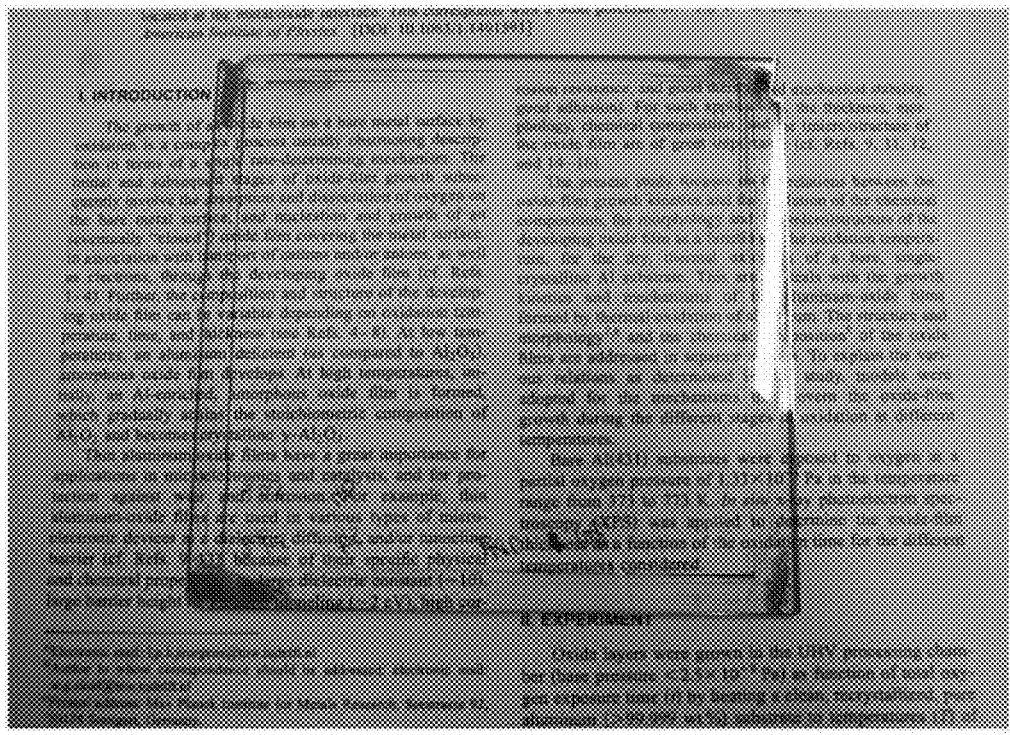

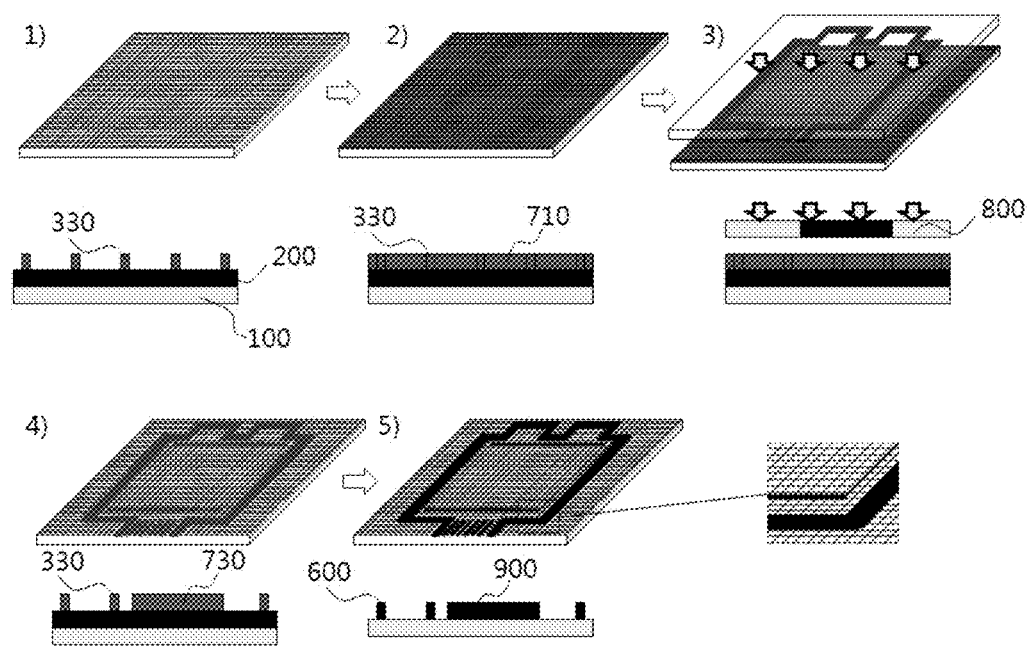
[Figure 14]

METHOD FOR FORMING CONDUCTIVE MESH PATTERN, AND MESH ELECTRODE AND LAMINATE MANUFACTURED THEREBY

TECHNICAL FIELD

This application is a National Stage Application of International Application No. PCT/KR2015/001487, filed Feb. 13, 2015, and claims the benefit of Korean Patent Application No. 10-2014-0016625, filed Feb. 13, 2014, the contents of which are incorporated herein by reference in their entirety for all purposes as if fully set forth below.

The present invention relates to a method for manufacturing a conductive mesh pattern, a mesh electrode manufactured by the same, and a laminate.

BACKGROUND ART

A portable terminal, such as a smart phone, an Internet device, and a portable game device, requires a slimmer appearance in order to improve portability for a user.

The portable terminals have limited sizes to be inconvenient to perform a user desired function by using a menu key, a number key, and a direction key, so that the portable terminal is currently configured so as to enable a user to directly select a menu item displayed on a screen by using a touch screen while the user views a screen.

The touch screen enables a user to touch a menu item displayed on a screen while viewing the screen to perform a desired function, so that the touch screen needs to be formed of a transparent material, and includes a touch electrode for detecting a touch input of the user.

The touch electrode is generally formed of two electrode lines having a crossing structure in the touch screen, and the two touch electrode lines may be formed in separate sheets, or in one sheet to determine a touch input of a user.

A touch screen having a lattice structure adopts a capacitive method, and a sensor electrode pattern is formed of a plurality of crossing first conductive-side lines and second conductive-side lines. When a touch object approaches the touch screen having the lattice structure, the first and second conductive-side lines, which are connected horizontally and vertically to each other, collect capacitance changed at the approaching point, and the touch screen analyzes a collected signal and detects a touch input.

An electrode of the touch screen adopts a transparent metal oxide, such as an indium tin oxide (ITO) having higher electric resistance than that of a conductive metal, but having high optical transmittance.

The transparent metal oxide does not have a problem in a device having a small surface area. Because a work function is large, and electric conductivity is not relatively high, there is a disadvantage in that when the surface area is increased, a voltage drop is generated.

When the transparent metal oxide is formed on a transparent film, such as a PET film, surface damage to a film is generated in proportion to a deposition time, and anion impact is generated, so that it is difficult to make a large touch screen.

In order to overcome the problem, US Patent Publication No. 2010-0156840 discloses a touch screen sensor for detecting a touch input by using a touch electrode having a mesh structure.

However, the touch electrode having the mesh structure may be visually recognized, or a Moiré effect may be exhibited by the mesh pattern.

When a line width of the touch electrode having the mesh structure is decreased, visual recognition and the Moiré effect are decreased, but there is a limit in an implementable line width of a micro pattern, and a method of implementing an ultrafine mesh structure having a line width in a submicrometer scale, which is less than 1 µm, has large processing cost, so that there is a problem in mass manufacturing and making the touch electrode large.

Accordingly, research on a reasonable manufacturing method capable of implementing an ultrafine mesh structure having a line width in a submicrometer scale, which is less than 1 µm, is demanded.

DISCLOSURE

Technical Problem

The present invention provides a method for manufacturing a conductive mesh pattern, a mesh electrode manufactured by the same, and a laminate.

Technical Solution

The present invention provides a method for manufacturing a conductive mesh pattern, including: a) forming a first photosensitive material layer on a conductive layer of a base substrate including the conductive layer; b) forming a first photosensitive material pattern layer by making a transparent photomask, in which linear patterns are carved, be in contact with an upper surface of the first photosensitive material layer; c) forming a second photosensitive material layer on the conductive layer provided with the first photosensitive material pattern layer; d) making the transparent photomask, in which the linear patterns are carved, be in contact with an upper surface of the second photosensitive material layer, so that the linear pattern of the first photosensitive material pattern layer crosses the linear pattern of the transparent photomask to form a second photosensitive material pattern layer on the conductive layer; e) etching portions of the conductive layer on which the first photosensitive material pattern layer and the second photosensitive material pattern layer are not formed; and f) removing the first photosensitive material pattern layer and the second photosensitive material pattern layer to manufacture conductive mesh patterns.

Further, the present invention provides a mesh electrode including the conductive mesh pattern having a line width of 100 nm or more and 900 nm or less manufactured by the method.

Further, the present invention provides a laminate, including: a base substrate; a conductive layer provided on the base substrate; first photosensitive material linear patterns provided on the conductive layer; and second photosensitive material linear patterns provided on the conductive layer and crossing the first photosensitive material linear patterns.

Advantageous Effects

According to the present invention, it is possible to manufacture an electrode having an ultrafine mesh structure having a line width in a submicrometer scale through a simple photo process.

The electrode having the ultrafine mesh structure having a line width in a submicrometer scale manufactured according to the present invention may overcome a limit of an intrinsic surface resistance value of an oxide layer compared to an existing metal oxide-based transparent electrode on a thin film, so that it is very easy to apply the electrode to a large area transparent electrode.

In a case where a plastic base substrate is used, even when the base substrate is curved or bent due to a structure of fine lines, it is possible to effectively distribute locally concentrated stress to the base substrate, so that the electrode may be easily applicable to a flexible electronic device.

The mesh electrode manufactured by the manufacturing method of the present invention is very easily used in an electrode structure of a touch panel of an electronic device.

The present invention may induce uniform contact of a photosensitive layer by using a soft phase difference mask, so that it is easy to form a pattern in a cylindrical mold having a plane, a non-plane, or a curved surface, and thus it is possible to easily apply a net mesh structure of a submicrometer scale to an automation process, such as a roll to roll process based on a cylindrical roll mold.

The present invention may form and overlap large area patterns having various sizes by using a transparent flexible base substrate as a photomask, or divide or independently form patterns having different shapes on a cylindrical curved surface of a cylindrical mold, thereby improving a degree of freedom of a process.

DESCRIPTION OF DRAWINGS

FIGS. 1 and 2 describe a principle of phase shift lithography.

FIG. 3 illustrates difficulty in manufacturing a mesh pattern of a submicrometer scale based on optical phase shift lithography.

FIG. 4 schematically illustrates a process of manufacturing a mesh electrode according to the present invention.

FIG. 5 is an optical microscope image of a chrome blank mask having a line pattern (repetition cycle of 80 μm) having a line width of 40 μm of Example 1.

FIG. 6 is an optical microscope image of a transparent photomask manufactured according to Example 1.

FIG. 7 is a schematic diagram and an optical microscope image of a photosensitive mesh pattern manufactured according to Example 1.

FIG. 8 is a schematic diagram and an optical microscope image of a conductive mesh pattern manufactured according to Example 1.

FIG. 9 is low magnification and high magnification scanning electronic microscope (SEM) images of the conductive mesh pattern manufactured according to Example 1.

FIG. 10 is a SEM image of the photosensitive material mesh pattern before Al etching.

FIG. 11 is a SEM image of the conductive mesh pattern after Al etching.

FIG. 12 is a SEM image of a pattern having a line width of 200 nm or less manufactured according to the present invention.

FIG. 13 illustrates transparency of a substrate provided with conductive mesh patterns (110×110 mm²) manufactured according to the present invention, in which there is no Moiré effect.

FIG. 14 schematically illustrates a process of manufacturing an electrode, to which a router pattern is added, according to another exemplary embodiment of the present invention.

EXPLANATION OF REFERENCE NUMERALS AND SYMBOLS

100: Base substrate 200: Conductive layer
310: First photosensitive material layer
330: First photosensitive material pattern layer
400: Transparent photomask in which linear patterns are carved
510: Second photosensitive material layer
530: Second photosensitive material pattern layer
600: Conductive mesh pattern
710: Third photosensitive material layer
730: Third photosensitive material pattern layer
800: Chrome blank mask
900: Router pattern

[Mode for Invention]

Hereinafter, the present invention will be described in detail.

An electrode having a net structure having a line width in a submicrometer scale has an electrode structure capable of minimizing a line width and maximizing transmittance in forming a conductive pattern by using a metal having high conductivity, and is easily applied to a large area and flexible electronic device, compared to an existing transparent electrode based on a metal oxide, such as an indium tin oxide (ITO). When electrode having a conductive layer is supplied to a flexible electronic device, the conductive layer is inevitably broken due to a large difference in a mechanical elastic modulus between a flexible base substrate and the conductive layer. When the electrode having the net structure having a line width in a submicrometer scale is applied to a flexible electronic device, and even when the base substrate is bent or curved by the structure of the fine line, it is possible to effectively disperse a locally concentrated stress to the base substrate, so that the electrode may be very easily used to be applied to the flexible electronic device.

A technology for manufacturing an existing nano structure has a limit in manufacturing the electrode, so that a new technology has been attempted. A micro/nano patterning technology using soft lithography is representatively used, and the soft lithography method refers to a new transfer method for making a pattern or a structure by using a flexible organic material without a complex device used in the existing photography.

In order to manufacture a mesh structure having a line width in a submicrometer scale by using phase shift lithography, a method for manufacturing a phase difference photolithography mask by controlling an interval between concavo-convex patterns having a checker board shape to have a submicro size by using electro-beam lithography has been suggested.

When a flexible base substrate formed with a pattern is used as a photomask, a phase difference of incident UV light is generated due to a difference in a refractive index between a medium (ex. glass n=1.45) and air (n=1.0) at a boundary interface between a pattern convex portion and a pattern concave portion as illustrated in FIG. 1. When a phase difference considering a height d of the pattern and a wavelength of incident UV light becomes an integer ratio of $2\pi$, destructive interference is locally generated, so that the phase shift lithography uses a phenomenon in which a null point having intensity of UV light close to 0 is formed in a local region of the convex pattern boundary or concave pattern boundary as illustrated in FIG. 2. Accordingly, it is possible to easily obtain a pattern of a submicrometer scale which is less than 1 micro even by using a general cheap UV lamp.

Considering a resolution (R=kl/NA (k: a process index, l: a wavelength of a light source, NA: an aperture ratio of a lens)) of a pattern obtainable by using a general blank mask, the phase shift lithography has an advantage in that it is possible to easily obtain a pattern of a submicrometer scale by using a cheap UV lamp even without using an expensive extreme UV light source. Further, the phase shift lithography has an advantage in that when a phase difference photomask is formed of a flexible material, the phase difference photomask has a very high adhesion property to a cylindrical mold by a property of a flexible base substrate, so that it is possible to form a uniform pattern over an entire region of a plane or non-plane (curved) base substrate.

It is very easy to manufacture a linear pattern having a line width w (<1 μm) having a submicro regime by using the phase shift lithography, but in order to manufacture a mesh structure in which patterns having an ultrafine line width to be applied to a transparent electrode are connected with and cross each other, it is necessary to manufacture a pattern base mask so that an interval d between the patterns is similar to the line width w (d≈w). The reason is that in the phase shift lithography, the pattern is patterned in a structure in which the patterns are closed along corners by a method of inducing photosensitization of the pattern by a near field locally exhibiting destructive interference at a boundary interface of corners of the patterns having a three-dimensional convex and concave shape of the phase difference photomask. Accordingly, in order to implement a mesh structure in which the patterns are connected with and cross each other, there is technical difficulty in that an interval between unit patterns of the phase difference photomask needs to be controlled to have a submicro regime.

By describing FIG. 3, when a phase difference photomask illustrated in FIG. 3A is used in order to manufacture a mesh pattern, an interval d between quadrangular patterns illustrated in FIG. 3B is increased in proportion to an interval g between convex patterns of the phase difference photomask. In order to overcome the problem and manufacture the mesh pattern, when the interval g between the convex patterns of the phase difference photomask is controlled to have a size of a submicro less than 1 μm as illustrated in FIG. 3C, it is possible to manufacture the mesh pattern illustrated in FIG. 3D.

There is a disadvantage in that in order to control the interval g between the convex patterns of the phase difference photomask to have the size of a submicro less than 1 μm as illustrated in FIG. 3C, it is necessary to use expensive ultrafine patterning equipment, such as an electro-beam or an ion beam, a manufacturing process has high difficulty, and the method is difficult to be applied in order to make the electrode be large due to a pattern process based on high vacuum.

The present invention relates to a method for manufacturing a conductive mesh pattern. Particularly, the present invention relates to a method for manufacturing a conductive mesh pattern having a line width of a submicrometer regime (<1 μm).

The present invention provides a method for manufacturing a conductive mesh pattern, including: forming a first photosensitive material pattern layer and a second photosensitive material pattern layer having linear patterns crossing linear patterns of the first photosensitive material pattern layer on a conductive layer of a base substrate including the conductive layer; etching portions of the conductive layer in which the first photosensitive material pattern layer and the second photosensitive material pattern layer are not formed; and removing the first photosensitive material pattern layer and the second photosensitive material pattern layer to manufacture conductive mesh patterns.

The present invention provides a method for manufacturing a conductive mesh pattern, including: a) forming a first photosensitive material layer on a conductive layer of a base substrate including the conductive layer; b) forming a first photosensitive material pattern layer by making a transparent photomask, in which linear patterns are carved, be in contact with an upper surface of the first photosensitive material layer; c) forming a second photosensitive material layer on the conductive layer provided with the first photosensitive material pattern layer; d) making the transparent photomask, in which the linear patterns are carved, be in contact with an upper surface of the second photosensitive material layer, so that the linear pattern of the first photosensitive material pattern layer crosses the linear pattern of the transparent photomask to form a second photosensitive material pattern layer on the conductive layer; e) etching portions of the conductive layer on which the first photosensitive material pattern layer and the second photosensitive material pattern layer are not formed; and f) removing the first photosensitive material pattern layer and the second photosensitive material pattern layer to manufacture conductive mesh patterns.

Step a) is a step of forming a first photosensitive material layer on a conductive layer of a base substrate including the conductive layer.

The type of base substrate is not specially limited, but may be selected from the base substrates generally used in the art. Particularly, the base substrate may be a transparent base substrate, for example, the transparent base substrate may include at least one of quartz, glass, and plastic, or be formed of at least one thereof.

The base substrate may include quartz or be formed of quartz. The quartz has excellent transmittance of a wavelength in a UV region band, excellent wear resistance, and an excellent mechanical property. In this case, it is possible to secure transmittance of UV for inducing curing by using a UV curing resin when a shape of a master pattern is copied later.

A thickness of the base substrate is not specially limited, but when the plastic base substrate is manufactured based on roll to roll using a mold or a phase difference mask, a thickness of the base substrate may be 40 μm or more and 400 μm or less.

The conductive layer may include at least one metal of silver (Ag), copper (Cu), aluminum (Al), gold (Au), nickel (Ni), titanium (Ti), molybdenum (Mo), tungsten (W), chrome (Cr), and platinum (Pt), or an alloy of two or more metals thereof.

The conductive layer may include a transparent metal oxide.

The type of transparent metal oxide is not specially limited, but may be selected from the transparent metal oxides generally used in the art. For example, the transparent metal oxide may include at least one of an indium tin oxide (ITO), an indium zinc oxide (IZO), an aluminum zinc oxide (AZO), an indium zinc tin oxide (IZTO), an aluminum zinc oxide-silver-aluminum zinc oxide (AZO-Ag-AZO), an indium zinc oxide-silver-indium zinc oxide (IZO-Ag-IZO), an indium tin oxide-silver-indium tin oxide (ITO-Ag-ITO), and an indium zinc tin oxide-silver-indium zinc tin oxide (IZTO-Ag-IZTO).

A stacking method of the conductive layer is not specially limited, but may be, for example, thermal deposition, sputtering, electro-beam deposition, a lamination processing method, or a solution coating method.

When a solution coating method is used as the stacking method of the conductive layer, the conductive layer may be formed on the base substrate by using at least one of a conductive metal precursor, a conductive metal oxide precursor, nano particles, nano lines, conductive textile, and a conductive polymer.

A thickness (height) of the conductive layer is not specially limited, but may be 5 nm or more and 10 μm or less.

The first photosensitive material layer formed on the conductive layer may be formed by applying a photosensitive material composition onto the conductive layer. The type of photosensitive material included in the photosensitive material composition is not specially limited, but when the photosensitive material has different solubility to a developer according to exposure, and the photosensitive material is cured by a thermal treatment after the pattern is formed, it is possible to establish a more stable processing condition.

The photosensitive material composition may be a positive photosensitive material composition or a negative photosensitive material composition, and is not specially limited. The photosensitive material composition may be a positive photosensitive material composition.

A content of solid of the photosensitive material composition may be varied according to viscosity and solid of the photosensitive material used, but for example, 10 weight % or more and 60 weight % or less based on a total weight of the photosensitive material composition.

A thickness of the first photosensitive material layer may be 0.01 μm or more and 10 μm or less.

Step b) is a step of forming a first photosensitive material pattern layer by making a transparent photomask, in which linear patterns are carved, be in contact with an upper surface of the first photosensitive material layer.

The transparent photomask may be a transparent photomask in which a linear pattern is convexly carved.

The transparent photomask may be a phase difference soft mask, and particularly, the mask may be a contact mask made of a soft material having a concavo-convex shape with a cycle of a micrometer size.

The transparent photomask in which the convex linear patterns are carved may have a linear recess and a linear protrusion. In this case, a line width of the protrusion and a line width of the recess may be the same as or different from each other, and a line width of the protrusion and a line width of the recess may be the same as each other.

In the transparent photomask, when a line width of the protrusion and a line width of the recess may be the same as each other, a line width of one protrusion and a line width of one recess may be defined as a cycle of the concavo-convex portion. For example, when a cycle of the concavo-convex portion of the transparent photomask is 80 μm, the cycle may mean the protrusion having a line width of 40 μm and the recess having a line width of 40 μm.

The cycle of the concavo-convex portion of the transparent photomask determines a pitch of a photosensitive material pattern formed by the transparent photomask. For example, when the cycle of the concavo-convex portion of the transparent photomask is 80 μm, a pitch of a photosensitive material pattern formed by the transparent photomask may be 40 μm. In this case, the pitch of a photosensitive material pattern means a distance between a center line in a longitudinal direction of a line width of any one pattern and a center line in a longitudinal direction of a line width of another pattern adjacent to the one pattern.

As long as a material of the transparent photomask is a flexible material having high transmissivity and low Young's modulus, the material of the transparent photomask is not specially limited, but the transparent photomask may include, for example, at least one of polydimethylsiloxane (PDMS)-based polymer, polymethyl methacrylate (PMMA), polyurethane acrylate (PUA), polystyrene (PS), polycarbonate (PC), polyvinyl alcohol (PVA), cyclicolefin copolymer (COP), polyethylene terephthalate (PET), and polyvinyl butadiene (PVB), or a copolymer thereof. Particularly, the transparent photomask may include a PDMS-based polymer, but is not essentially limited thereto.

A line width of the linear pattern convexly carved in the transparent photomask may be varied according to a pattern desired to be finally implemented. In consideration of a wavelength of a UV light source used, formation of a near field optical pattern caused by destructive interference, and dropping of a depressed portion of the concavo-convex portion of the pattern by the flexible material of the transparent photomask, the line width of the linear pattern convexly carved in the transparent photomask may be 2 μm or more and 500 μm or less.

The cycle of the concavo-convex portion formed in the transparent photomask may be designed and predicted through Equations 1 and 2 based on a grid interval determining transmittance and a surface resistance value of the manufactured mesh electrode, and has a value caused by a line width of the mesh electrode and a characteristic of a material of the used metal of the electrode. The cycle of the concavo-convex portion of the transparent photomask may be 20 μm or more and 160 μm or less.

$$R_{S,TOT} = \xi \frac{\rho_G}{t_G f_F} \quad \text{(Equation 1)}$$

$$T_{TOT} = T_{sub} \times (1 - f_F)^2 \quad \text{(Equation 2)}$$

In this case, $\rho_G$ and $t_G$ represent resistivity and a thickness of a conductive grid, respectively, $\xi$ is a correction coefficient of a process caused by a process of forming a metal layer, and $f_F$ represents an area ratio by which the metal layer occupies the substrate, that is, a filling factor. $T_{sub}$ represents transmissivity of the base substrate, and $T_{TOT}$ represents final transmissivity of a base substrate including a conductive mesh.

A height of the linear convex pattern of the transparent photomask, that is, a height of the protrusion, may be 50 nm or more and 500 μm or less.

When the transparent photomask is in contact with the upper surface of the first photosensitive material layer, a surface of the transparent photomask, in which the linear patterns are carved, may be in contact with the upper surface of the first photosensitive material layer. In this case, a phase difference of ultraviolet rays incident into the transparent photomask is generated due to a difference between a refractive index of the transparent photomask and a refractive index of air, and a null point having intensity of ultraviolet rays close to 0 may be formed at a boundary of the protrusion and the recess of the pattern, that is, an interface in which the transparent photomask is in contact with air, due to destructive interference.

Step b) may include: b-1) irradiating ultraviolet rays onto the transparent photomask after making the transparent photomask be in contact with the upper surface of the first photosensitive material layer;

b-2) removing the transparent photomask, developing the first photosensitive material layer by using a developer, and forming a first photosensitive material pattern layer; and b-3) curing the formed first photosensitive material pattern layer.

In step b-1), the first photosensitive material layer is divided into a portion, to which ultraviolet rays are irradiated, and a portion, to which ultraviolet rays are not irradiated, by the transparent photomask, and the portion of the first photosensitive material layer, to which ultraviolet rays are irradiated, may have high solubility to the developer.

In step b-1), intensity of the irradiated ultraviolet rays is not specially limited, but, may be, for example, 10 mJ/cm$^2$ or more and 200 mJ/cm$^2$ or less.

As long as a developer is a solution capable of melting the portion of the first photosensitive material layer, to which ultraviolet rays are irradiated, the developer used in step b-2) is not specially limited, but the developer may be an alkali developer, and for example, potassium hydroxide (KOH).

Step b) may further include drying the formed first photosensitive material pattern layer after step b-2). In this case, a solvent and the like included in the first photosensitive material pattern layer may be gasified.

As long as a temperature enables the solvent and the like included in the first photosensitive material pattern layer to be gasified, a temperature for drying the first photosensitive material pattern layer is not specially limited.

In step b-3), the cured first photosensitive material pattern layer may be hardened and fixated.

In step b-3), the temperature for curing the first photosensitive material pattern layer may be 150° C. or more and 250° C. or less.

The first photosensitive material pattern layer formed in step b) may be the cured first photosensitive material pattern layer. In this case, when a process of forming a second photosensitive material pattern layer on the conductive layer provided with the first photosensitive material pattern layer is performed, there may be less or no damage to the pattern, such as the cured first photosensitive material pattern layer is separated or melted.

A line width of the linear pattern of the first photosensitive material pattern layer may be 100 nm or more and 900 nm or less.

Step c) is a step of forming a second photosensitive material layer on the conductive layer provided with the first photosensitive material pattern layer.

A thickness of the second photosensitive material layer may be the same as or close to the thickness (height) of the first photosensitive material pattern layer. The thickness of the second photosensitive material layer may be varied according to the thickness (height) of the first photosensitive material pattern layer, but may be, for example, 0.01 µm or more and 10 µm or less.

The second photosensitive material layer may be formed by applying a photosensitive material composition onto the conductive layer provided with the first photosensitive material pattern layer.

The photosensitive material composition forming the second photosensitive material layer may be the same as or different from the photosensitive material composition forming the first photosensitive material layer.

Step d) is a step of making the transparent photomask, in which linear patterns are carved, be in contact with an upper surface of the second photosensitive material layer, so that the linear pattern of the first photosensitive material pattern layer crosses the linear pattern of the transparent photomask to form a second photosensitive material pattern layer on the conductive layer.

In step d), the transparent photomask, in which the linear patterns are carved, is in contact with the upper surface of the second photosensitive material layer, so that the linear pattern of the first photosensitive material pattern layer crosses the linear pattern of the transparent photomask, and here, "cross" means that the transparent photomask, in which the linear patterns are carved, is in contact with the upper surface of the second photosensitive material layer so that the linear pattern of the first photosensitive material pattern layer is orthogonal to or has a predetermined angle with the linear pattern of the phase difference soft mask.

Step d) may include: d-1) irradiating ultraviolet rays onto the transparent photomask after making the transparent photomask be in contact with the upper surface of the second photosensitive material layer;

d-2) removing the transparent photomask, developing the second photosensitive material layer by using a developer, and forming a second photosensitive material pattern layer; and d-3) curing the formed second photosensitive material pattern layer.

Step d) may further include drying the formed second photosensitive material pattern layer after step d-2).

Steps d-1), d-2), and d-3), and the drying step may quote the descriptions of steps b-1), b-2), and b-3), and the drying step, and the steps may be independently performed under the same condition as or different conditions from those of steps b-1), b-2), and b-3), and the drying step, respectively.

The second photosensitive material pattern layer formed in step d) may be the cured second photosensitive material pattern layer.

The transparent photomask in step d) may quote the description of the aforementioned transparent photomask.

The transparent photomask in step d) may be the same as or different from the transparent photomask in step b).

A line width of the linear pattern of the second photosensitive material pattern layer may be 100 nm or more and 900 nm or less.

According to another particular example of the present invention, an additional submicro pattern or micro pattern may be manufactured by patterning the photosensitive material on the conductive layer three or more times.

After step d), the method may further include: forming a third photosensitive material layer on the conductive layer on which the first photosensitive material pattern layer and the second photosensitive material pattern layer are formed; and forming a third photosensitive material pattern layer on the conductive layer.

A thickness of the third photosensitive material layer may be the same as or close to the thicknesses (heights) of the first photosensitive material pattern layer and the second photosensitive material pattern layer. The thickness of the third photosensitive material pattern layer may be varied according to the thicknesses (heights) of the first photosensitive material pattern layer and the second photosensitive material pattern layer, but may be, for example, 0.01 µm or more and 10 µm or less.

The third photosensitive material layer may be formed by applying a photosensitive material composition onto the conductive layer provided with the first photosensitive material pattern layer and the second photosensitive material pattern layer.

The photosensitive material composition forming the third photosensitive material layer may be the same as or different from the photosensitive material composition forming at least one of the first photosensitive material layer and the second photosensitive material pattern layer.

In the exemplary embodiment of the present invention, the step of forming the third photosensitive material pattern layer may be a step of forming the third photosensitive material pattern layer on the conductive layer by disposing the photomask having a light transmission portion and a light non-transmission portion on the third photosensitive material layer while being spaced apart from the third photosensitive material layer.

The photomask includes the light transmission portion and the light non-transmission portion according to the carved pattern, and the carved pattern may be the light transmission portion or the light non-transmission portion. The pattern of the photomask is not specially limited. For example, when the conductive layer has a mesh pattern for a touch panel, the pattern carved in the photomask may be a router pattern. The router pattern is a configuration connectable with a mesh pattern for a touch panel and connectable with an external flexible printed circuit board.

In another exemplary embodiment of the present invention, the step of forming the third photosensitive material pattern layer may be a step of making the transparent photomask, in which the linear patterns are carved, be in contact with an upper surface of the third photosensitive material layer, so that at least one of the linear pattern of the first photosensitive material pattern layer and the linear pattern of the second photosensitive material pattern layer crosses or is in parallel to the linear pattern of the transparent photomask to form a third photosensitive material pattern layer on the conductive layer.

By adding the step, it is possible to manufacture the mesh electrode, in which the pattern shape having a triangular, a rectangular, square, or polygonal arrangement and the like is formed, by overlapping or connecting the submicro patterns or micro patterns.

Step e) is a step of etching portions of the conductive layer on which the first photosensitive material pattern layer and the second photosensitive material pattern layer are not formed.

The etch process in step e) may be performed by using a general dry etch or wet etch method, but considering reliability of the conductive pattern having a micro line width and a defect of a product, the etch process may be performed by a dry etch method.

When an additional photosensitive material pattern layer is formed after step d), step e) may be a step of etching portions of the conductive layer in which the first photosensitive material pattern layer, the second photosensitive material pattern layer, and the additional photosensitive material pattern layer are not formed.

When the third photosensitive material pattern layer is formed after step d), step e) may be a step of etching portions of the conductive layer in which the first photosensitive material pattern layer, the second photosensitive material pattern layer, and the third photosensitive material pattern layer are not formed.

Step f) is a step of removing the first photosensitive material pattern layer and the second photosensitive material pattern layer to manufacture conductive mesh patterns.

The method of removing the first and second photosensitive material pattern layers is not specially limited, and may adopt a method generally used in the art.

When an additional photosensitive material pattern layer is formed after step d), the first photosensitive material pattern layer, the second photosensitive material pattern layer, and the additional photosensitive material pattern layer may be removed in step f).

When the third photosensitive material pattern layer is formed after step d), the first photosensitive material pattern layer, the second photosensitive material pattern layer, and the third photosensitive material pattern layer may be removed in step f).

As illustrated in FIG. 4, a method for manufacturing a conductive mesh pattern according to a first exemplary embodiment of the present invention may include: a) forming a first photosensitive material layer 310 on a conductive layer 200 of a base substrate 100 including the conductive layer 200; b) forming a first photosensitive material pattern layer 330 by making a transparent photomask 400, in which linear patterns are carved, be in contact with an upper surface of the first photosensitive material layer 310; c) forming a second photosensitive material layer 510 on the conductive layer provided with the first photosensitive material pattern layer; d) making the transparent photomask 400, in which the linear patterns are carved, be in contact with an upper surface of the second photosensitive material layer 510, so that the linear pattern of the first photosensitive material pattern layer 330 crosses the linear pattern of the transparent photomask to form a second photosensitive material pattern layer 530 on the conductive layer; e) etching portions of the conductive layer 200 on which the first photosensitive material pattern layer 330 and the second photosensitive material pattern layer 530 are not formed; and f) removing the first photosensitive material pattern layer and the second photosensitive material pattern layer to manufacture conductive mesh patterns 600.

As illustrated in FIGS. 4 and 14, a method for manufacturing a conductive mesh pattern according to a second exemplary embodiment of the present invention may include: forming a first photosensitive material layer 310 on a conductive layer 200 of a base substrate 100 including the conductive layer 200; forming a first photosensitive material pattern layer 330 by making a transparent photomask 400, in which linear patterns are carved, be in contact with an upper surface of the first photosensitive material layer 310; forming a second photosensitive material layer 510 on the conductive layer provided with the first photosensitive material pattern layer; making the transparent photomask 400, in which the linear patterns are carved, be in contact with an upper surface of the second photosensitive material layer 510, so that the linear pattern of the first photosensitive material pattern layer 330 crosses the linear pattern of the transparent photomask to form a second photosensitive material pattern layer 530 on the conductive layer; forming a third photosensitive material layer 710 on the conductive layer 200 on which the first photosensitive material pattern layer 330 and the second photosensitive material pattern layer 530 are formed; forming a third photosensitive material pattern layer 730 on the conductive layer by disposing a chrome blank mask 800 on the third photosensitive material layer 710 while being spaced apart from the third photosensitive material layer 710; etching portions of the conductive layer 200 on which the first photosensitive material pattern layer 330, the second photosensitive material pattern layer 530, and the third photosensitive material pattern layer 730 are not formed; and removing the first photosensitive material pattern layer 330, the second photosensitive material pattern layer 530, the third photosensitive material pattern layer 730 to manufacture router patterns 900 together with conductive mesh patterns 600.

The method for manufacturing the conductive mesh pattern of the present invention may be applied to a roll to roll process.

When the method for manufacturing the conductive mesh pattern of the present invention is applied to a roll to roll process, the transparent photomask, in which the linear patterns are carved, may include a blanket which is provided on an external peripheral surface of a hollow cylindrical base substrate, and in which linear patterns are carved, and an ultraviolet lamp provided inside the cylindrical base substrate.

In this case, as long as a material of the hollow cylindrical base substrate may enable ultraviolet rays to pass through and has a mechanical property capable of resisting impact applicable when the transparent photomask is rotated, the material of the hollow cylindrical base substrate is not specially limited, but the material of the hollow cylindrical base substrate may be, for example, quartz or glass.

When the method is applied to a roll to roll process, the base substrate provided with the conductive mesh patterns may be a flexible film. For example, the base substrate may be a plastic film, and a material of the plastic film is not specially limited, and may adopt a material generally used in the art.

The present invention provides a mesh electrode including the conductive mesh pattern having a line width of 100 nm or more and 900 nm or less manufactured by the aforementioned method.

A description of the mesh electrode may quote the above description of the method for manufacturing the conductive mesh pattern.

The conductive mesh pattern may include at least one metal of silver (Ag), copper (Cu), aluminum (Al), gold (Au), nickel (Ni), titanium (Ti), molybdenum (Mo), tungsten (W), chrome (Cr), and platinum (Pt), or an alloy of two or more metals thereof.

For example, the conductive mesh pattern may include a transparent metal oxide, and particularly, the conductive mesh pattern may include at least one of an indium tin oxide (ITO), an indium zinc oxide (IZO), an aluminum zinc oxide (AZO), an indium zinc tin oxide (IZTO), an aluminum zinc oxide-silver-aluminum zinc oxide (AZO-Ag-AZO), an indium zinc oxide-silver-indium zinc oxide (IZO-Ag-IZO), an indium tin oxide-silver-indium tin oxide (ITO-Ag-ITO), and an indium zinc tin oxide-silver-indium zinc tin oxide (IZTO-Ag-IZTO).

In the present invention, the "mesh" means a net shape, and may include a shape in which two or more lines cross, as well as orthogonal grid patterns.

The conductive mesh pattern may be a grid pattern in which lines of two groups are orthogonal to each other. A pitch of a linear pattern of a first group in a horizontal direction may be the same as or different from a pitch of a linear pattern of a second group in a vertical direction. Particularly, the pitch of the linear pattern of the first group may be the same as the pitch of the linear pattern of the second group.

Each of a line width of the linear pattern of the first group and a line width of the linear pattern of the second group may be 100 nm or more and 900 nm or less.

Each of the pitches of the linear patterns of the first and second groups may be 2 μm or more and 500 μm or less. Particularly, each of the pitches of the linear patterns of the first and second groups may be 10 μm or more and 80 μm or less.

The mesh electrode may further include an additional submicro pattern or micro pattern formed through an additional photosensitive material pattern layer.

Particularly, the mesh electrode may further include a router pattern layer.

The mesh electrode may be used as at least one of a mesh electrode for a touch panel, an auxiliary electrode for an organic light emitting device, and a metal electrode for an organic light emitting device, and a mesh electrode for an organic solar cell. Particularly, the mesh electrode may be a mesh electrode for a touch panel.

The present invention provides a laminate, including: a base substrate; a conductive layer provided on the base substrate; first photosensitive material linear patterns provided on the conductive layer; and second photosensitive material linear patterns provided on the conductive layer and crossing the first photosensitive material linear patterns.

A description of the laminate may quote the above description of the method for manufacturing the conductive mesh pattern.

As long as heights of the first and second photosensitive material linear patterns are the same as or close to each other, the heights of the first and second photosensitive material linear patterns are not specially limited, but may be, for example, 0.01 μm or more and 10 μm or less.

Line widths of the first and second photosensitive material linear patterns may be 100 nm or more and 900 nm or less.

Each of the pitches of the first and second photosensitive material linear patterns may be 2 μm or more and 500 μm or less. Particularly, each of the pitches of the first and second photosensitive material linear patterns may be 10 μm or more and 80 μm or less.

The laminate may further include an additional submicro pattern or an additional micro pattern provided on the conductive layer.

The laminate may further include a third photosensitive material pattern provided on the conductive layer. The third photosensitive material pattern may be a linear pattern or a third pattern connected with the first and second photosensitive material linear patterns according to a usage, and for example, the third photosensitive material pattern may be a router pattern connected with the first and second photosensitive material linear patterns.

A thickness of the third photosensitive material pattern may be the same as or close to the thicknesses (heights) of the first and second photosensitive material linear patterns. The thickness of the third photosensitive material pattern is changed according to the thicknesses (heights) of the first and second photosensitive material linear patterns, but may be, for example, 0.01 μm or more and 10 μm or less.

Materials of the first and second photosensitive material linear patterns may be the same as or different from each other. That is, photosensitive material compositions of the first and second photosensitive material linear patterns may be the same as or different from each other.

A material of the third photosensitive material pattern may be the same as or different from that of at least one of the first and second photosensitive material linear patterns. The photosensitive material composition forming the third photosensitive material pattern may be the same as or different from the photosensitive material composition forming at least one of the first photosensitive material linear pattern and the second photosensitive material linear pattern.

The conductive layer may include at least one metal of silver (Ag), copper (Cu), aluminum (Al), gold (Au), nickel (Ni), titanium (Ti), molybdenum (Mo), tungsten (W), chrome (Cr), and platinum (Pt), or an alloy of two or more metals thereof.

The conductive layer may include a transparent metal oxide. For example, the conductive layer may include at least one of an indium tin oxide (ITO), an indium zinc oxide (IZO), an aluminum zinc oxide (AZO), an indium zinc tin oxide (IZTO), an aluminum zinc oxide-silver-aluminum zinc oxide (AZO-Ag-AZO), an indium zinc oxide-silver-indium zinc oxide (IZO-Ag-IZO), an indium tin oxidesilver-indium tin oxide (ITO-Ag-ITO), and an indium zinc tin oxide-silver-indium zinc tin oxide (IZTO-Ag-IZTO).

[Mode for Carrying out the Invention]

Hereinafter, the present invention will be described with reference to Examples below in more detail. However, the following Examples are set forth to illustrate the present invention, but do not intend to limit the present invention.

EXAMPLE 1

Manufacture a Soft Contact Mask

As illustrated in FIG. 5, a pattern was manufactured by using an existing photolithography process by using a chrome (Cr) blank mask having a line pattern (about 80 µm of a repetition cycle) of a line width of about 40 µm and using a photosensitive material of AZ1512 (an undiluted solution) or SU8 25 (diluted by 300%, propylene glycol monomethyl ether acetate (PGMEA)), a polydimethyl siloxane (PDMS) prepolymer and a hardener were mixed at a ratio of 9:1, the mixture was poured onto the pattern, the mixture was solidified by heat curing, the mixture was separated from the photosensitive material pattern to manufacture a PDMS transparent photomask in which linear patterns were carved. An optical microscope image of the manufactured transparent photomask is illustrated in FIG. 6.

Manufacture a Photosensitive Material Pattern

Aluminum (Al) was deposited on quartz in a thickness of 50 nm by a vacuum sputtering process, and then a first photosensitive material layer was formed by coating and drying a photosensitive material on aluminum (Al). In this case, a thickness of the first photosensitive material layer was adjusted to be about 100 nm to 400 nm. After the transparent photomask was in contact with the first photosensitive material layer, an exposed (Karl Suss MA8 mask aligner, 1000 W), developed (a developer CPD18), and dried first photosensitive material pattern layer was formed. In this case, the amount of exposure was adjusted to a range of 10 mJ/cm$^2$ to 200 mJ/cm$^2$. Then, the dried first photosensitive material pattern layer was heat treated at a temperature of 150° C. to 250° C. for about ten minutes and cured. Next, a second photosensitive material layer was additionally formed on an aluminum provided with the first photosensitive material pattern layer in the same order as that of the first photosensitive material pattern layer, and then a second photosensitive material pattern layer was formed on the aluminum by rotating the same transparent photomask at 90° and making the transparent photomask be in contact with the second photosensitive material layer, and then exposing, developing, drying, and curing the second photosensitive material layer. As a result, photosensitive material mesh patterns having a line width of 100 nm to 900 nm and a pitch of 40 µm were manufactured on the aluminum. A schematic diagram and and optical microscope image of the formed photosensitive material mesh pattern are illustrated in FIG. 7.

Manufacture a Conductive Mesh Pattern

Conductive mesh patterns were manufactured by dry etching an Al layer having a thickness of 50 nm by using the mesh photosensitive patterns manufactured on the aluminum as an etch mask. A schematic diagram and an image of an optical microscope of the manufactured conductive mesh patterns are illustrated in FIG. 8, and a SEM image thereof is illustrated in FIG. 9.

In this case, a process condition of the dry etch is represented below.

Process pressure: 5 m Torr
Kind of gas and flow rate: BCl$_3$:Cl$_2$=35:15 sccm
Etch application power: ICP:RF=300:30 W

The invention claimed is:

1. A method for manufacturing a conductive mesh pattern, comprising:
   a) forming a first photosensitive material layer on a conductive layer of a base substrate including the conductive layer;
   b) forming a first photosensitive material pattern layer by making a transparent photomask, in which linear patterns are carved, be in contact with an upper surface of the first photosensitive material layer;
   c) forming a second photosensitive material layer on the conductive layer provided with the first photosensitive material pattern layer;
   d) making the transparent photomask, in which the linear patterns are carved, be in contact with an upper surface of the second photosensitive material layer, so that the linear pattern of the first photosensitive material pattern layer crosses the linear pattern of the transparent photomask to form a second photosensitive material pattern layer on the conductive layer;
   e) etching portions of the conductive layer on which the first photosensitive material pattern layer and the second photosensitive material pattern layer are not formed; and
   f) removing the first photosensitive material pattern layer and the second photosensitive material pattern layer to manufacture conductive mesh patterns.

2. The method of claim 1, further comprising:
   after step d), forming a third photosensitive material layer on the conductive layer on which the first photosensitive material pattern layer and the second photosensitive material pattern layer are formed; and
   forming a third photosensitive material pattern layer on the conductive layer.

3. The method of claim 1, wherein a line width of the linear pattern of the transparent photomask is 2 µm or more and 500 µm or less.

4. The method of claim 1, wherein a line width of the conductive mesh pattern is 100 nm or more and 900 nm or less.

5. The method of claim 1, wherein the conductive layer includes at least one metal of silver (Ag), copper (Cu), aluminum (Al), gold (Au), nickel (Ni), titanium (Ti), molybdenum (Mo), tungsten (W), chrome (Cr), and platinum (Pt), or an alloy of two or more metals thereof.

6. The method of claim 1, wherein the conductive layer includes a transparent metal oxide.

7. The method of claim 1, wherein the conductive layer includes at least one of an indium tin oxide (ITO), an indium zinc oxide (IZO), an aluminum zinc oxide (AZO), an indium zinc tin oxide (IZTO), an aluminum zinc oxide-silver-aluminum zinc oxide (AZO-Ag-AZO), an indium zinc oxide-silver-indium zinc oxide (IZO-Ag-IZO), an indium tin oxide-silver-indium tin oxide (ITO-Ag-ITO), and an indium zinc tin oxide-silver-indium zinc tin oxide (IZTO-Ag-IZTO).

8. The method of claim 1, wherein the transparent photomask includes at least one of polydimethylsiloxane (PDMS)-based polymer, polymethyl methacrylate (PMMA), polyurethane acrylate (PUA), polystyrene (PS), polycarbonate (PC), polyvinyl alcohol (PVA), cyclicolefin copolymer (COP), polyethylene terephthalate (PET), and polyvinyl butadiene (PVB), or a copolymer thereof.

9. The method of claim 1, wherein a thickness of the conductive layer is 5 nm or more and 10 µm or less.

10. The method of claim 1, wherein a thickness of each of the first photosensitive material layer and the second photosensitive material layer is 0.01 µm or more and 10 µm or less.

11. The method of claim 1, wherein steps b) and d) respectively include irradiating ultraviolet rays having intensity of 10 mJ/cm² or more and 200 mJ/cm² or less onto the transparent photomask after making the transparent photomask be in contact with the upper surface of the first photosensitive material layer or the second photosensitive material layer.

12. The method of claim 1, wherein in step a), a method of forming the conductive layer includes thermal deposition, sputtering, electro-beam deposition, a lamination processing method, or a solution coating method.

13. A mesh electrode comprising a conductive mesh pattern having a line width of 100 nm or more and 900 nm or less manufactured by the method of claim 1.

14. The mesh electrode of claim 13, wherein the conductive mesh pattern includes at least one metal of silver (Ag), copper (Cu), aluminum (Al), gold (Au), nickel (Ni), titanium (Ti), molybdenum (Mo), tungsten (W), chrome (Cr), and platinum (Pt), or an alloy of two or more metals thereof.

15. The mesh electrode of claim 11, wherein the conductive mesh pattern includes at least one of an indium tin oxide (ITO), an indium zinc oxide (IZO), an aluminum zinc oxide (AZO), an indium zinc tin oxide (IZTO), an aluminum zinc oxide-silver-aluminum zinc oxide (AZO-Ag-AZO), an indium zinc oxide-silver-indium zinc oxide (IZO-Ag-IZO), an indium tin oxide-silver-indium tin oxide (ITO-Ag-ITO), and an indium zinc tin oxide-silver-indium zinc tin oxide (IZTO-Ag-IZTO).

16. A laminate, comprising:
a base substrate;
a conductive layer provided on the base substrate;
first photosensitive material linear patterns provided on the conductive layer; and
second photosensitive material linear patterns provided on the conductive layer and crossing the first photosensitive material linear patterns.

17. The laminate of claim 16, further comprising:
third photosensitive material linear patterns provided on the conductive layer.

18. The laminate of claim 16, wherein line widths of the first photosensitive material linear pattern and the second photosensitive material linear pattern is respectively 100 nm or more and 900 nm or less.

19. The laminate of claim 16, wherein the conductive layer includes at least one metal of silver (Ag), copper (Cu), aluminum (Al), gold (Au), nickel (Ni), titanium (Ti), molybdenum (Mo), tungsten (W), chrome (Cr), and platinum (Pt), or an alloy of two or more metals thereof.

20. The laminate of claim 16, wherein the conductive layer includes at least one of an indium tin oxide (ITO), an indium zinc oxide (IZO), an aluminum zinc oxide (AZO), an indium zinc tin oxide (IZTO), an aluminum zinc oxide-silver-aluminum zinc oxide (AZO-Ag-AZO), an indium zinc oxide-silver-indium zinc oxide (IZO-Ag-IZO), an indium tin oxide-silver-indium tin oxide (ITO-Ag-ITO), and an indium zinc tin oxide-silver-indium zinc tin oxide (IZTO-Ag-IZTO).

* * * * *